(12) United States Patent
Verenchikov

(10) Patent No.: US 9,728,384 B2
(45) Date of Patent: Aug. 8, 2017

(54) ELECTROSTATIC TRAP MASS SPECTROMETER WITH IMPROVED ION INJECTION

(75) Inventor: Anatoly N. Verenchikov, St. Petersburg (RU)

(73) Assignee: LECO Corporation, St. Joseph, MI (US)

( * ) Notice: Subject to any disclaimer, the term of this patent is extended or adjusted under 35 U.S.C. 154(b) by 0 days.

(21) Appl. No.: 13/976,218

(22) PCT Filed: Dec. 29, 2011

(86) PCT No.: PCT/US2011/067783
§ 371 (c)(1),
(2), (4) Date: Aug. 7, 2013

(87) PCT Pub. No.: WO2012/092457
PCT Pub. Date: Jul. 5, 2012

(65) Prior Publication Data
US 2013/0313425 A1    Nov. 28, 2013

(30) Foreign Application Priority Data
Dec. 29, 2010    (GB) .................................. 1022050.7

(51) Int. Cl.
H01J 49/42    (2006.01)
H01J 49/00    (2006.01)
H01J 49/40    (2006.01)
H01J 49/06    (2006.01)
H01J 49/02    (2006.01)

(52) U.S. Cl.
CPC .......... *H01J 49/0031* (2013.01); *H01J 49/06* (2013.01); *H01J 49/4245* (2013.01); *H01J 49/027* (2013.01); *H01J 49/406* (2013.01); *H01J 49/4205* (2013.01); *H01J 49/4255* (2013.01)

(58) Field of Classification Search
CPC ......... H01J 49/42; H01J 49/0031; H01J 49/06
See application file for complete search history.

(56) References Cited

U.S. PATENT DOCUMENTS 5,739,530 A * 4/1998 Franzen et al. ............... 250/288
5,886,346 A * 3/1999 Makarov ....................... 250/291
(Continued)

FOREIGN PATENT DOCUMENTS

CN    101366097 A    2/2009
CN    101578684 A    11/2009
(Continued)

OTHER PUBLICATIONS

International Search Report for PCT/US2011/067783, dated May 16, 2012, four pages.
(Continued)

*Primary Examiner* — Wyatt Stoffa
*Assistant Examiner* — James Choi
(74) *Attorney, Agent, or Firm* — Honigman Miller Schwartz and Cohn LLP

(57) ABSTRACT

A method of mass spectral analysis in an analytical electrostatic trap (14) is disclosed. The electrostatic trap (14) defines an electrostatic field volume and includes trap electrodes having static and non-ramped potentials. The method comprises injecting a continuous ion beam into the electrostatic field volume.

26 Claims, 2 Drawing Sheets

(56) References Cited

U.S. PATENT DOCUMENTS

| | | | |
|---|---|---|---|
| 9,082,604 B2* | 7/2015 | Verenchikov | H01J 49/4245 |
| 9,312,119 B2* | 4/2016 | Verenchikov | H01J 49/406 |
| 2007/0029473 A1* | 2/2007 | Verentchikov | 250/281 |
| 2007/0176090 A1* | 8/2007 | Verentchikov | 250/287 |
| 2009/0294656 A1* | 12/2009 | Koster | H01J 49/425 |
| | | | 250/283 |
| 2010/0084549 A1* | 4/2010 | Ermakov | H01J 49/4245 |
| | | | 250/283 |
| 2010/0193682 A1* | 8/2010 | Golikov | H01J 49/4245 |
| | | | 250/287 |
| 2010/0301204 A1* | 12/2010 | Koster | H01J 49/425 |
| | | | 250/283 |
| 2011/0084205 A1* | 4/2011 | Makarov et al. | 250/282 |
| 2015/0120897 A1* | 4/2015 | Colin | H04L 61/2528 |
| | | | 709/223 |

FOREIGN PATENT DOCUMENTS

| | | | |
|---|---|---|---|
| DE | 69629920 T2 | 5/2004 | |
| JP | 2005538346 A | 12/2005 | |
| JP | 2007526596 A | 9/2007 | |
| JP | 2009-512162 A | 3/2009 | |
| JP | 2010509732 A | 3/2010 | |
| JP | 2010531038 A | 9/2010 | |
| WO | 9630930 A1 | 10/1996 | |
| WO | WO-2004008481 A1 | 1/2004 | |
| WO | WO-2005001878 A2 | 1/2005 | |
| WO | 2007044696 A1 | 4/2007 | |
| WO | WO-2007044696 A1 | 4/2007 | |
| WO | 2008063497 A2 | 5/2008 | |
| WO | WO-2008063497 A2 | 5/2008 | |
| WO | WO 2008063497 A2 * | 5/2008 | |
| WO | WO-2009001909 A2 | 12/2008 | |
| WO | WO-2012092457 A1 | 7/2012 | |

OTHER PUBLICATIONS

Office Action for related Japanese Application No. 2013-547668 dated Jun. 19, 2014.

Office Action for related Chinese Application No. 201180062947.X dated Apr. 27, 2015.

Office Action for related German Application No. 112011104647.2 dated Apr. 13, 2015.

* cited by examiner

ELECTROSTATIC TRAP MASS SPECTROMETER WITH IMPROVED ION INJECTION

CLAIM OF PRIORITY

This application is a 371 of International Application No. PCT/US2011/067783, filed Dec. 29, 2011, which claims priority to Application No. GB1022050.7, filed on Dec. 29, 2010, the entire contents of each of the above applications being incorporated herein by reference.

TECHNICAL FIELD

The disclosure generally relates to the area of mass spectroscopic analysis, electrostatic traps, and to electrostatic traps with continuous ion injection.

BACKGROUND

Known electrostatic traps (E-traps) employ electrostatic fields for indefinite spatial confinement (trapping) of moving ions, and for arranging highly isochronous ion oscillations. Ions packets are injected into the E-trap field, and ionic oscillation frequencies are detected by an image current detector. Ion mass to charge ratio (m/z) may then determined in calibration experiments since the oscillation frequency F is proportional to $(m/z)^{1/2}$. Spectra may be reconstructed from signal waveforms by the Fourier Transformation (FT).

U.S. Pat. No. 6,013,913A, U.S. Pat. No. 5,880,466, and 6,744,042, incorporated herein by reference, appear to describe I-path E-traps that employ coaxial ion mirrors for isochronous ion trapping. Ion packets are pulsed injected via a pulsed ion mirror. The described technique appears to suffers low space charge capacity. Injection of more than 1E+4 ions can cause the self-bunching and the coalescence of ion packets.

GB2418528, incorporated herein by reference, appears to describe an I-path ion trap that utilizes radiofrequency fields for radial ion confinement. This system can be impractical due to the combination of limited space charge capacity of the I-path trap and poor image current detection.

U.S. Pat. No. 5,886,346, incorporated herein by reference, appears to describe an orbital trap that uses a cylindrical trap in combination with a hyper-logarithmic electrostatic field. As described, an injection of ions from an external ion source into the electrostatic orbital trap volume is necessarily accompanied by ramping of analytical electrostatic field as ions would otherwise hit trap electrodes. Because ramped potentials conflict with the potential stability, the prolonged injection in combination with the potential ramping causes variations of ion parameters Vs ion mass and, as a result, causes multiple artifacts in spectra. For this reason, optimal parameters have been achieved with pulsed ion injection wherein the duration of injected ion packets is in the order of 100 ns (Makarov et al, JASMS., v. 20 (2009) #8, pp 1391-1396, incorporated herein by reference). This pulsed injection can complicate the formation of ion packets with extended volume and well controlled size, which is desirable for increasing space charge capacity and for minimizing higher harmonic signals.

U.S. Pat. No. 7,994,473, incorporated herein by reference, appears to describe arranging the reciprocal ion motion within a three-dimensional electrostatic field. But to avoid ion losses occurring on the walls within the system, the ion injection also appears to require the ramping of electrostatic potentials. While FIG. 3B appears to prevent side ion excursions along the Z-axis, potential ramping still yields a more limited injection time. Additionally, this potential ramping can tend to affect mass accuracy (parts per million) due to a lower stability of time variable power supply.

In co-pending application WO2011086430, incorporated herein by reference, there is disclosed an extended E-trap which is expected to improve the E-trap space charge capacity of electrostatic traps by orders of magnitude as compared to earlier cited orbital and three dimensional E-traps. The proposed hollow cylindrical geometry can provide significant elongation of the trapping volume without sacrificing the size of the analyzer. But efficiency of the described trap may be limited by pulsed schemes of ion injection.

The speed of spectral acquisition significantly improves when analyzing signals using the Filter Diagonalization Method (FDM) described in Aizikov et al, JASMS 17 (2006) 836-843, incorporated herein by reference. The described method appears to require sinusoidal signals which can lead to an introduction of artifacts and peaks that correspond to higher oscillation harmonics when injecting short ion packets.

Thus, prior art E-traps employ pulsed injection of ion packets accompanied by potential ramping or switching which affects parameters of electrostatic traps. The system described may obviate or mitigate at least one or more of the aforementioned problems and may improve the ion flux throughput and the duty cycle of electrostatic trap mass spectrometers.

SUMMARY

Methods of mass spectral analysis are disclosed. In an embodiment, a method may comprise the step of injecting a continuous ion beam into an electrostatic field volume of an analytical electrostatic trap with static and non ramped potentials on trap electrodes and for a pre-defined period. Among other possibilities, the method can be used for "extended" E-traps as described in WO2011086430 for which the injection period can be 100 to 1000 fold longer compared ion oscillation cycle.

In an implementation, the injection period is longer than one of the group: (i) at least 100 ion oscillations within the electrostatic trap (ii) at least 300 ion oscillations within the electrostatic trap; (iii) a period sufficient for filling the entire drift length of the electrostatic trap by lightest (m/z) ions; and (iv) a period sufficient for filling the entire drift length of said electrostatic trap by heaviest (m/z) ions. In an implementation, the method further comprises a step of effecting motion of the trapped ions (sharpening).

In an implementation, a method of mass spectral analysis may comprise:

(a) forming an electrostatic trapping field having reflecting field regions, spaced by a field-free region; wherein the field provides isochronous ion oscillations in the first X-direction and indefinite trapping of moving ions by spatial focusing in the second transverse Y-direction; wherein the field is substantially extended in the third Z-direction;

(b) injecting a continuous ion beam into said trapping field at a small inclination angle with respect to the first X-direction for a period longer than at least 100 ion oscillations within said trap;

(c) effecting motion of trapped ions;

(d) detecting an image current signal induced by oscillating ions; and (e) converting the signal into spectrum of oscillating frequencies with the subsequent conversion into m/z spectrum.

In an implementation, the step of effecting motion of trapped ions may comprise one step of the group: (i) a pulsed ion excitation; (ii) a pulsed removal of ion portion; (iii) a resonant excitation of ions within a limited span of oscillation frequencies; (iv) a pulsed expansion or contraction of said trapping field; and (v) pulsed repulsion of ion packets within said field-free region. In an implementation, the method may further comprise an intermediate ion accumulation in radiofrequency (RF) fields between steps of said continuous ion injection. In an implementation, the reflecting electrostatic field region comprises at least one field region of the group: (i) a field of ion mirrors; (ii) a field of electrostatic sectors; and (iii) a hybrid field having features of both—of ion mirrors and of electrostatic sectors. The electrostatic field extended in the Z-direction may comprise a two-dimensional field of the group: (i) a hollow cylindrical filed; and (ii) a planar field equipped with isochronous edge-bounding field. For accelerating the mass spectral analysis, in an implementation, the method may further include multiplexing the electrostatic field volumes and distributing the continuous beam into the electrostatic field volumes for parallel and independent mass analysis from either single or multiple ion sources. In an embodiment, the step of converting image current signal into frequency spectrum comprises either Fourier analysis or Filter Diagonalization Method (FDM).

Electrostatic trap mass spectrometers are also described. In an implementation, such spectrometers may comprise an ion source to form a continuous ion beam, an electrostatic trap having ion reflecting regions spaced by a field-free region. In an implementation, the shape and potentials of the electrostatic trap electrodes may be selected to provide isochronous ion oscillations in a first X-direction and spatial ion confinement in the second Y-direction; said trap is substantially extended in the third Z-direction.

In an embodiment, the spectrometer may include injection optics to introduce the continuous ion beam into the electrostatic trap without ramping the electrostatic trap potentials. Additionally, ion steering means may be incorporated to direct the ion beam within they X-Y plane and at a small inclination angle with respect to the X-direction for the period of ion beam injection into said trap. Next, means for effecting motion of at least a portion of trapped ions (sharpener) may be incorporated into the spectrometer. In an implementation, the spectrometer may further include a detector to measure an image current signal that is induced by moving ion clouds. The spectrometer may further include means for reconstructing mass spectra from detector signal waveforms.

In an implementation, the electrostatic trap further comprises a radio-frequency (RF) ion guide for ion accumulation and periodic release of a continuous ion beam. In an implementation, the electrostatic trap comprises one electrode set of the group: (i) at least two electrostatic ion mirrors; (ii) at least two electrostatic deflecting sectors; and (iii) at least one ion mirror and at least one electrostatic sector. The electrodes may provide substantially two-dimensional electrostatic field with one field symmetry of the group: (i) of planar symmetry, wherein E-trap electrodes are parallel and are linearly extended; and (ii) of cylindrical symmetry, wherein E-trap electrodes are circular to form hollow cylindrical field volumes. The injection optics may comprise one of the groups: (i) an aperture in one of the E-trap electrodes; (ii) an aperture in a temporarily biased section of the E-trap electrodes; (iii) a field-free space and a deflector; (iv) an edge of elongated electrodes forming a planar two-dimensional field; and (v) a section of said electrostatic trap. The ionization means may comprise either a mass spectrometer or an ion mobility device followed by a fragmentation cell. The set of electrodes may comprise a set of aligned slits forming multiplicity of trapping electrostatic fields, and wherein said injection optics comprises means for multiplexing ion flow between said trapping volumes.

DESCRIPTION OF DRAWINGS

Various embodiments of the present invention together with arrangement given illustrative purposes only will now be described, by way of example only, and with reference to the accompanying drawings in which.

Like reference symbols in the various drawings indicate like elements.

DETAILED DESCRIPTION

Prior art electrostatic traps (E-traps) often employ pulsed injection of compact ion packets. A pulsed scheme can limit the parameters of ion packets due to (a) accumulation of ion packets within a fine volume thereby inducing a space charge repulsion of ions; (b) extraction of ion packets with strong fields thereby inducing relatively large energy spreads of hundreds of electron-Volts; (c) time-of-flight separation occurring between an accumulating trap and an analytical E-trap, which may restrict injected mass range; and (d) a pulsed admission of ions into an analytical E-trap which can cause pulsed potentials and related instability of analytical E-trap voltages.

In an aspect, a system is provided that uses a prolonged injection of a continuous ion beam into an E-trap having constant electrostatic potentials. In an implementation, the ion beam is provided for at least 100 ion oscillation cycles to help ensure a complete and uniform filling of the E-trap volume with ions. In an implementation, the prolonged injection becomes possible because of using E-traps with a field-free region and substantial extension of the E-traps along the drift direction. In an implementation, the assembly of trapped moving ions may then be "sharpened" in order to detect the oscillation frequencies by an image current detector. Various described sharpening techniques allow the system to obtain prolonged ion packets (comparable with E-trap oscillation path) with well defined and (m/z) independent length which, in turn, can improve signal processing and remove higher order signal harmonics.

Figure 1:
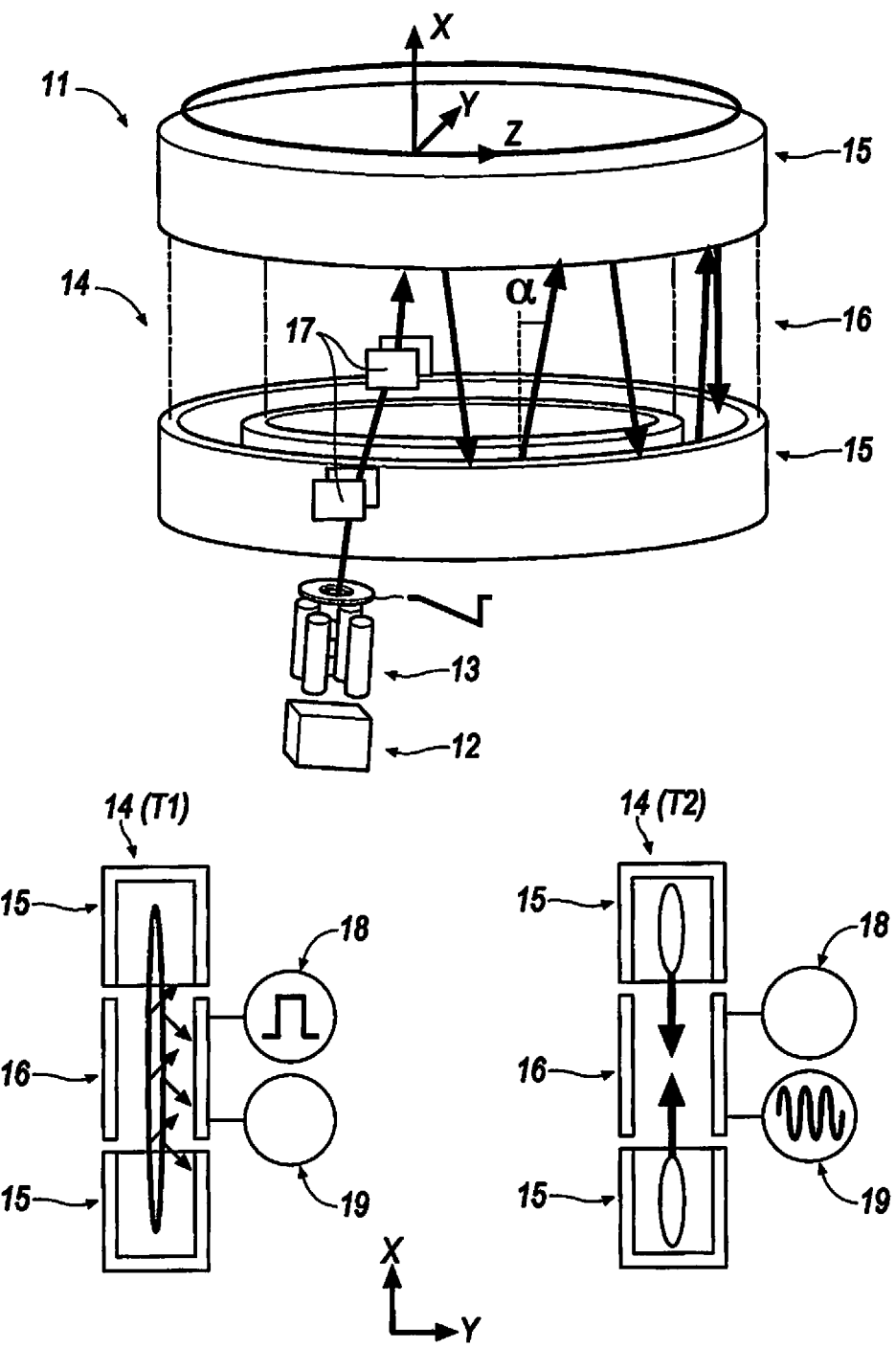
FIG. 1 depicts an injection of a continuous ion beam into a torroidal E-trap formed of two circular ion mirrors.

Referring to FIG. 1, one embodiment 11 of an electrostatic trap (E-trap) mass spectrometer comprises a continuous ion source 12, an accumulating radio-frequency (RF) ion guide 13, followed by differentially pumped transfer ion optics (not shown); an electrostatic hollow cylindrical trap 14 formed of two gridless ion mirrors 15 separated by a drift space 16; steering means 17; means for effecting ion motion 18 within the trap 14; and an image current circuit 19 connected to a shield electrode of the drift space 16. The figure also shows momentarily slices of the trap 14 at times T1 and T2 denoted as 14(T1) and 14(T2).

In operation, two planar gridless ion mirrors 15 are aligned parallel and are spaced by a field-free region 16 arranged within shield electrodes (shown by dashed line). In an implementation, mirrors are set symmetric relative to the X-Z plane. Each mirror may exemplarily be composed of at least four pairs of circular electrodes (not shown) to form a hollow cylindrical volume with a substantially two-dimensional electrostatic field. In an embodiment, each mirror may comprise an attracting lens electrode. The field in the ion mirrors may be adjusted to provide spatial ion focusing in the Y-direction and isochronous properties with respect to ion energy in the X-direction, to spatial and angular beam divergences in the Y-direction, and compensation of cross-term aberrations to at least second order of the Tailor expansion, so as time-to-energy focusing to at least third order. In an implementation, at least one pair of opposite ring electrodes has an adjustable voltage bias to steer ion packets in the radial direction and this way keeping ions near the circular Z-axis.

Source 12 may provide a continuous ion beam. The ion beam may accumulate in the trapping RF guide 13, assisted by DC or RF repulsion at the exit end, and operating at an intermediate gas pressure of 0.01-10 mbar for collisional ion dampening between ion ejection cycles. Periodically the exit of the trapping ion guide 13 opens (shown by symbolic ramped voltage profile on the exit electrode) to yield a prolonged ion flow, preferably without forming sharp ion spikes. In an implementation, ion flow may be provided for the entire E-trap filling cycle, typically in the time scale of several milliseconds. Continuous ion beam (shown by fat arrows) thereby enters the E-trap 14 via the field-free region 16 and via steering means 17 at a small angle α relative to the X-axis, for example, at 1 to 3 degrees inclination angle with respect to the X-Axis. Steering means 17 may provide ion beam displacement in the Y-direction to bypass mirror electrodes. Next, ion beam may be reflected by ion mirrors 15 and thereby propagate in the circular Z-direction. As a result of the E-trap 14 having a long perimeter, it will take a long time (milliseconds) and at or around at least 100 ion oscillation cycles in the X-direction before ions may complete the full round within the torroidal E-trap and enter the injection region after approximately 100 to 300 ion reflections by mirrors. In one method, the RF trap 13 gets closed and the steering means 17 are switched off to avoid disturbance of trapped ions. Light ions may then fill the entire volume, while heavy ions may fill part of E-trap volume. In another method, the injection cycle lasts until the heaviest m/z ions fill the entire trap volume. Lighter m/z ions will then be partially lost and the injection duty cycle may be proportional to square root of ion (m/z.). In yet another method, the inclination angle may be chosen such that ion displacement per oscillation cycle is longer than thickness of steering means 17 in the Z-direction. A notable portion of ion beam may then bypass the steering means and would start next round. The foregoing method can allow more uniform duty cycle per (m/z). At completion of the fill cycle, the trapping guide 13 closes and incoming ions are stored within guide 13 until the next injection cycle.

In the next equalization stage, trapped ions may continue oscillating between mirrors. The trapped ions spread and mix in the Z-direction, and homogeneously fill the trap in the X-direction. The steering means 17 (for example, a pair of deflection plates) are provided such that no electrode lies within the ion path, and the steering means do not disturb ion motion at switched off regime. At this stage, there is no coherent signal on the image current circuit 19.

In the next—"sharpening" stage, at time T1 the means 18 are switched on, as shown for trap 14(T1) at T1 stage, to effect motion of trapped ions. In an embodiment, a short voltage pulse is applied between shield electrodes to deflect all the ions within the field-free region 16. The ions which happen to fly within ion mirrors form a pair of ion packets oscillating in opposite directions as shown in icon 14(T2). The length of thus formed ion packets are independent on ion (m/z).

In the next—"detection stage", oscillations of the remaining ions induce the signal waveform on the circuit 19. In an implementation, the waveform may be analyzed either with the Fourier transformation or with the Filter Diagonalization Method (FDM) for extracting frequencies of ion oscillations F, corresponding (m/z) values (m/z)~F2, and for extracting the corresponding signal intensities, i.e. mass spectra. In an implementation, a typical detection stage lasts 0.01-1 sec depending on the E-trap size, the required resolution and depending on the signal analysis method.

In one numerical example, the trap X-size (distance between mirror caps) is 200 mm, E-trap diameter is 300 to 500 mm, acceleration voltage is 8 keV and target resolution is 100,000. Then oscillation period for m/z=1000 amu ions is 5 us. If using FDM analysis method, the signal acquisition should last for approximately 20,000 cycles, i.e. for 0.1 sec. For the same numerical example, ion filling stage takes 100 to 1000 reflection cycles, i.e. 0.5 to 5 ms. Since analysis takes 100 ms, the intermediate storing ion guide can be held at relatively low gas pressure, down to 0.05 mBar, still sufficient for collisional ion dampening between ion release cycles.

The described intermediate ion storage method provides an exceptional ion capacity as RF quadrupole ion guides can hold 1E+8 to 1E+9 ions, which far exceeds the capacity of pulsed extracting ion traps, like C-trap (3E+6 ions). The phase space of the extracted continuous ion beam is much smaller than of pulsed extracted ion packets as the transverse beam emittance yields about 1-10 mm2meV and the axial energy spread is under 1 eV. Pulsed traps generate notably larger transverse emittance (due to space charge repulsion of the localized ion cloud in RF traps) and the axial energy spread of several hundred electron-Volts. As a result, the disclosed system yields better isochronicity of ion motion and, therefore, E-traps with higher resolving power.

The novel injection method eschews pulsing of precise potentials on ion mirrors which also yields accuracy and resolving power. The formation of elongated ion packets within the E-trap extends the E-trap charge capacity. In an implementation, an E-trap having a 200 mm cap-to-cap distance and 300 mm torroid diameter, the space occupied by ion cloud could be estimated as 50,000 mm$^3$. Assuming a space charge threshold of 1E+4 ions/mm3, the space charge capacity of the exemplar E-trap is estimated as 1E+9 ions/injection. Additionally, the formation of elongated ion packets with the (m/z) independent length is well suited for an FDM signal analysis—as it provides the sinusoidal waveforms and avoids higher harmonics. The disclosed method also incorporates a precise initial phase of ion oscillations which is advantageous for signal analysis.

There are multiple viable variations of the described apparatus and method. In an implementation, the E-trap may be a hollow cylindrical E-trap (as shown in FIG. 1) or a planar E-trap with Z-edge electrostatic plugs. Also, the E-trap may be formed of ion mirrors, electrostatic sectors, any combination of those, so as of hybrid fields having features of both—ion mirrors and sectors. In one example, the E-trap may allow strong orbital motion while using radial deflecting fields.

In an implementation, the intermediate ion storage trap may comprise a three-dimensional RF ion trap or any form of an ion guide. For example, it may be a quadrupole, a higher multipole ion guide, a ring, a channel RF ion guide and the like. In an implementation, the ion trapping and continuous release may be assisted by RF or DC barrier. The 'soft' ion release may be formed either with pulsing the barrier at small amplitude or by slow ramping down of the barrier. In connection with high intensity ion beams (e.g., 1E+11 ions/sec) past ICP source, the ion guide stage may be omitted, and the ion beam may come from the ion source 12 directly, though at 1 to 5% duty cycle (the ion beam is utilized only for the about 1 to 5 ms filling time, while the beam is lost during signal acquisition time). Still, the number of injected ions is sufficient for signal analysis at high dynamic range (estimated as 1E+6 to 1E+7) while matching space charge capacity of the E-trap.

Ion injection into the E-trap can be arranged either via the field free space with assistance of pulsed steering means (as shown in FIG. 1), or via a segment of ion mirror temporarily having lower potential, or via a Z-edge of a planar E-trap.

Multiple alternative methods may be used for 'sharpening' of the stored ion cloud in the E-trap. One alternative is exciting ions in the X-direction, either pulsed or (m/z) resonant, to provide an excitation within a limited (m/z) span (e.g. to simplify spectral decoding). Another alternative is to adjust the ion storage space, e.g. by trapping ions within a shorter region in the X-direction by an additional retarding hard mirror and then switching off such additional retarding and releasing ions into a longer analytical trapping volume. Such mirror may be arranged as a set of electrodes in the middle plain of the E-trap, thus forming a gridless mirror. The foregoing method can advantageous as it saves ions, but it requires using longer traps as a result of mechanical and electrical constraints.

The voltage floating arrangement may vary. In one alternative, the intermediate ion trap may be provided at nearly ground potential and the field free space may be floated. Then the image current detector has to be floated which may introduce an additional electronic noise onto the detector. In another alternative, the intermediate ion trap is temporarily floated prior to ion injection in order to keep the detector at ground bias.

Figure 2:
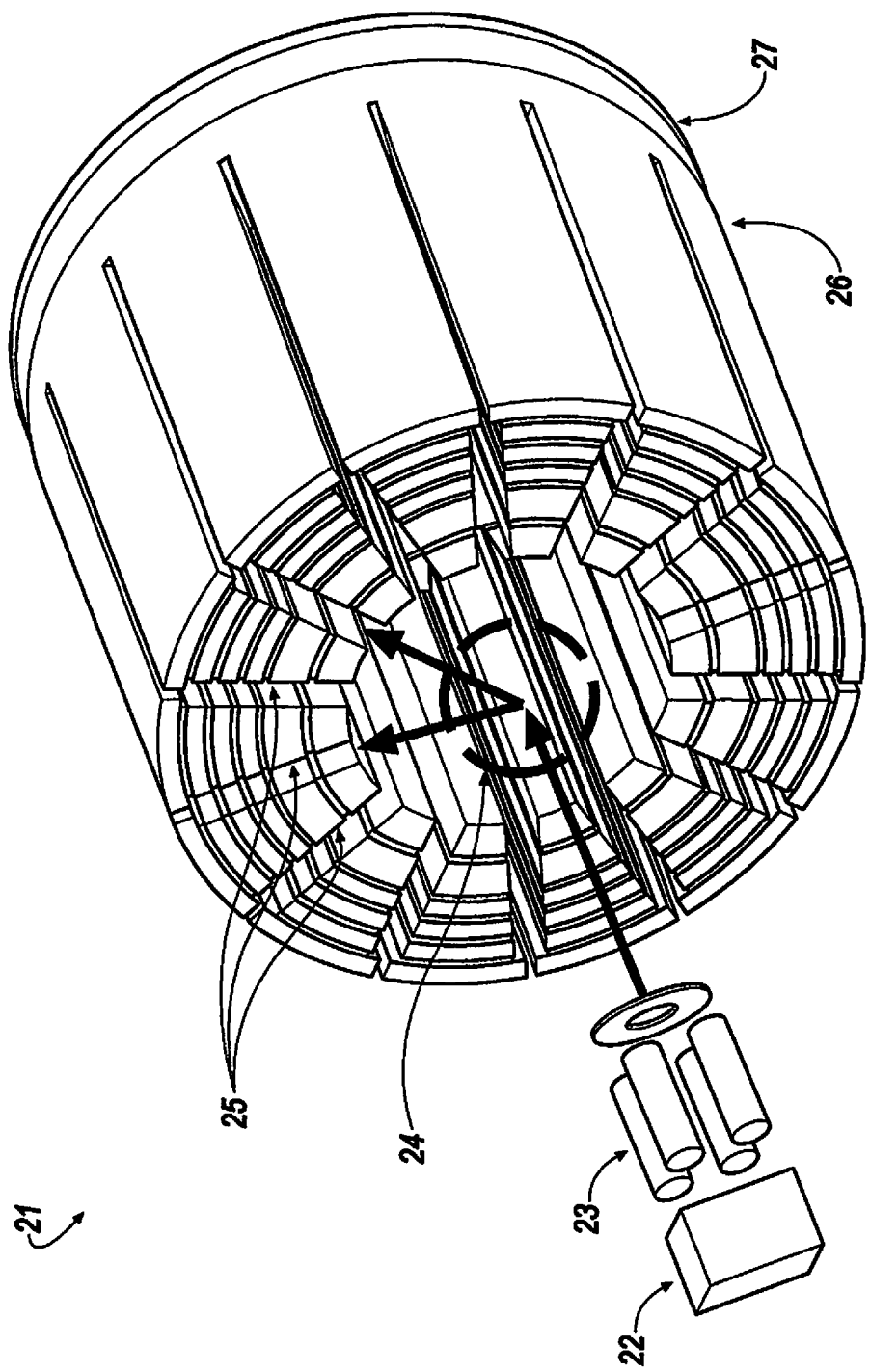
FIG. 2 depicts an injection of a continuous ion beam into a multiplexed E-trap.

Referring to FIG. 2, to enhance the analysis throughput, the novel injection method may be combined with multiplexed E-traps. In an implementation, multiple volumes 25 of electrostatic trapping field are arranged by cutting a set of aligned slits within the same electrode sandwich 26. The set of linear E-traps may be equipped with Z-electrostatic plugs 27 for trapping ions in the Z-direction. A single source 22 supplies a quasi-continuous ion beam to multiple RF trapping volumes 23. In an implementation, a steering set 24 is employed for either continuous or pulsed alternated distribution of ion flow between multiple E-traps. Alternatively, multiple sources may be employed for parallel ion injection into multiple E-traps. The multiplexed arrangement improves the speed and dynamic range of the analysis.

Although the present invention has been describing with reference to preferred embodiments, it will be apparent to those skilled in the art that various modifications in form and detail may be made without departing from the scope of the present invention as set forth in the accompanying claims.

What is claimed is:

1. A method of mass spectral analysis in an analytical electrostatic trap, wherein the analytical electrostatic trap defines an electrostatic field volume and includes pairs of circular trap electrodes having substantially constant and non-ramped potentials, the method comprising:

injecting a continuous ion beam into the electrostatic field volume of the analytical electrostatic trap for a period longer than at least 100 ion oscillations;

isochronously oscillating the continuous ion beam throughout the electrostatic field volume;

trapping ions of the isochronously oscillating continuous ion beam within the electrostatic field volume of the analytical electrostatic trap; and detecting an image current signal induced by the ions of the isochronously oscillating continuous ion beam.

2. The method as set forth in claim 1, wherein the electrostatic trap includes a drift length, and wherein the period is selected from the group consisting of:
(i) longer than at least 300 ion oscillations within the electrostatic trap;
(ii) sufficient to fill the entire drift length of the electrostatic trap with the lightest (m/z) ions; and
(iii) sufficient to fill the entire drift length of the electrostatic trap with the heaviest (m/z) ions.

3. The method as set forth in claim 1, further comprising: effecting motion of the trapped ions.

4. The method as set forth in claim 3, further comprising:
forming an electrostatic trapping field having reflecting field regions spaced by a field-free region, wherein the field provides isochronous ion oscillations in the first X-direction and indefinite trapping of moving ions by spatial focusing in the second transverse Y-direction, and wherein the field is substantially extended in the third Z-direction, wherein the step of effecting motion of trapped ions is further selected from the group consisting of:
(i) a pulsed ion excitation;
(ii) a pulsed removal of ion portion;
(iii) a resonant excitation of ions within a limited span of oscillation frequencies;
(iv) a pulsed expansion or contraction of the trapping field; and
(v) pulsed repulsion of ion packets within the field-free region.

5. A method of mass spectral analysis in an analytical electrostatic trap including pairs of circular trap electrodes, the method comprising:
forming an electrostatic trapping field having reflecting field regions spaced by a field-free region, wherein the field provides isochronous ion oscillations in the first X-direction and indefinite trapping of isochronously oscillating ions throughout the analytical electrostatic trap by spatial focusing in the second transverse Y-direction, and wherein the field is substantially extended in the third Z-direction;

injecting a continuous ion beam into the trapping field at a small inclination angle with respect to the first X-direction for a period longer than at least 100 ion oscillations within said trap;

effecting motion of trapped ions;

detecting image current signal induced by the oscillating ions; and converting said signal into spectrum of oscillating frequencies with the subsequent conversion into (m/z) spectrum.

6. The method as set forth in claim 5, wherein the step of effecting motion of trapped ions is further selected from the group consisting of:
(i) a pulsed ion excitation;
(ii) a pulsed removal of ion portion;
(iii) a resonant excitation of ions within a limited span of oscillation frequencies;

(iv) a pulsed expansion or contraction of the trapping field; and
(v) pulsed repulsion of ion packets within the field-free region.

7. The method as set forth in claim 5 further comprising: intermediately accumulating ions in radiofrequency (RF) fields between periods of continuous ion injection.

8. The method as set forth in claim 5, wherein said reflecting electrostatic field region comprises at least one field region selected from the group consisting of:
(i) a field of ion mirrors;
(ii) a field of electrostatic sectors; and
(iii) a hybrid field having features of both of ion mirrors and of electrostatic sectors.

9. The method as set forth in claim 5, wherein the electrostatic field extended in the Z-direction comprises a two-dimensional field selected from the group consisting of:
(i) a hollow cylindrical field; and
(ii) a planar field equipped with isochronous edge-bounding field.

10. The method as set forth in claim 5, wherein said step of ion beam injection comprises one step selected from the group consisting of:
(i) injection via the field-free region, assisted by switched ion displacement in the Y-direction;
(ii) injection via Z-edge of said field-free region;
(iii) injection via a switched section of electrostatic ion mirror; and
(iv) injection via a switched section of electrostatic sector.

11. The method as set forth in claim 5 further comprising: multiplexing electrostatic field volumes; and
distributing said continuous ion beam into said electrostatic field volumes for parallel and independent mass analysis from either single or multiple ion sources.

12. The method as set forth in claim 5, wherein said step of converting the image current signal into frequency spectrum comprises either
a Fourier analysis or
a Filter Diagonalization Method (FDM).

13. An electrostatic trap mass spectrometer comprising:
an ion source to form a continuous ion beam;
an electrostatic trap having ion reflecting regions spaced by a field-free region, wherein the electrostatic trap includes pairs of circular trap electrodes having substantially constant and non-ramped potentials, wherein a shape and potentials of said electrostatic trap provide isochronous ion oscillations in a first X-direction and spatial ion confinement in the second Y-direction, and wherein the trap is substantially extended in the third Z-direction;
injection optics for introducing the continuous ion beam for a period longer than at least 100 ion oscillations throughout the electrostatic trap without ramping of electrostatic trap potentials;
a controller configured to control the injection optics to introduce the continuous ion beam for a period longer than at least 100 ion oscillations throughout the electrostatic trap without ramping of electrostatic trap potentials;
ion steering means for directing said ion beam within an X-Y plane and at a small inclination angle with respect to the X-direction for the period of ion beam injection into said trap;
means for effecting motion of at least a portion of trapped oscillating ions;
a detector for measuring image current signal induced by moving ion clouds; and
means for reconstructing mass spectra from detector signal waveforms.

14. The trap as set forth in claim 13, further comprising a radio-frequency ion guide for ion accumulation and to provide a periodic release of the continuous ion beam.

15. The trap as set forth in claim 13, wherein the electrostatic trap comprises
electrostatic trap electrodes, wherein the electrostatic trap electrodes are selected from the group consisting of:
(i) at least two electrostatic ion mirrors;
(ii) at least two electrostatic deflecting sectors; and
(iii) at least one ion mirror and at least one electrostatic sector.

16. The trap as set forth in claim 15, wherein the electrostatic trap electrodes provide a substantially two-dimensional electrostatic field with one field symmetry selected from the group consisting of:
(i) of planar symmetry, wherein the electrostatic trap electrodes are parallel and linearly extended; and
(ii) of cylindrical symmetry, wherein the electrostatic trap electrodes are circular to form hollow cylindrical field volumes.

17. The trap as set forth in claim 13, wherein the injection optics are selected from the group consisting of:
(i) an aperture in one of the electrostatic trap electrodes;
(ii) an aperture in a temporarily biased section of the electrostatic trap electrodes;
(iii) a field-free space and a deflector;
(iv) an edge of the electrostatic trap electrodes forming a planar two-dimensional field; and
(v) a section of said electrostatic trap.

18. The trap as set forth in claim 13, wherein said ion steering means is selected from the group consisting of
a mass spectrometer; and
an ion mobility device followed by a fragmentation cell.

19. The trap as set forth in claim 13, wherein said electrostatic trap electrodes comprises
a set of aligned slits forming multiplicity of trapping electrostatic fields, and wherein said injection optics comprises
means for multiplexing ion flow between said trapping volumes.

20. The method as set forth in claim 1 further comprising:
multiplexing electrostatic field volumes; and
distributing said continuous ion beam into said electrostatic field volumes for parallel and independent mass analysis from either single or multiple ion sources.

21. The method as set forth in claim 5, wherein the electrostatic trapping field includes trap electrodes having substantially constant and non-ramped potentials.

22. The method as set forth in claim 1, further comprising:
isochronously reflecting the trapped ions within the electrostatic field volume to complete a filling cycle of electrostatic field volume with the trapped ions; and
terminating the continuous ion beam injection into the electrostatic field volume upon completion of the filling cycle.

23. The method as set forth in claim 22, further comprising:
affecting ion motion after the terminating step by
applying a short voltage pulse between shield electrodes to form a pair of ion packets oscillating in opposite direction.

24. The method as set forth in claim 23, further comprising:
providing an equalization period after the filling cycle and before ion motion is affected.

25. The method as set forth in claim 1, wherein the analytical electrostatic trap includes an electrostatic hollow torroidal-shaped trap.

26. The method as set forth in claim 1, wherein the trap electrodes include a pair of opposite ring-shaped electrodes.

* * * * *